United States Patent [19]

Kennedy

[11] 4,272,355
[45] Jun. 9, 1981

[54] PROCESS OF BONDING SPUTTERING TARGETS TO TARGET ELECTRODES

[75] Inventor: Thomas N. Kennedy, San Jose, Calif.

[73] Assignee: International Business Machines Corporation, Armonk, N.Y.

[21] Appl. No.: 124,679

[22] Filed: Feb. 26, 1980

[51] Int. Cl.$^3$ ............................................. C23C 15/00
[52] U.S. Cl. ................................. 204/298; 204/192 R
[58] Field of Search ........................... 204/298, 192 R

[56] References Cited

U.S. PATENT DOCUMENTS

| 3,294,661 | 12/1966 | Maissel ................................. 204/192 |
| 4,204,936 | 5/1980 | Hartsough ....................... 204/192 R |

OTHER PUBLICATIONS

J. van Esdonk et al., "Joining a Sputtering Target and a Backing Plate", *Research/Development*, Jan. 1975, pp. 41–44.

J. L. Vossen et al., *Thin Film Processes*, Academic Press, New York, 1978, pp. 31–33.

G. R. Giedd et al., "Indium Bond For Silicon Chip Attachment", IBM Technical Disclosure Bulletin, vol. 11, No. 2, (Jul. 1968), p. 117.

W. A. Dawson et al., "Indium–Lead–Indium Chip Joining", IBM Technical Disclosure Bulletin, vol. 11, No. 11, (Apr. 1969), p. 1528.

*Primary Examiner*—Delbert E. Gantz
*Assistant Examiner*—William Leader
*Attorney, Agent, or Firm*—Nathan N. Kallman

[57] ABSTRACT

In the process of sputter deposition of targets on target electrodes, a gallium-indium eutectic alloy is employed to form a floating bond between the target material and the target electrode. Relatively high radio frequency (r.f.) power density is used to increase the deposition rate without cracking the target.

7 Claims, 1 Drawing Figure

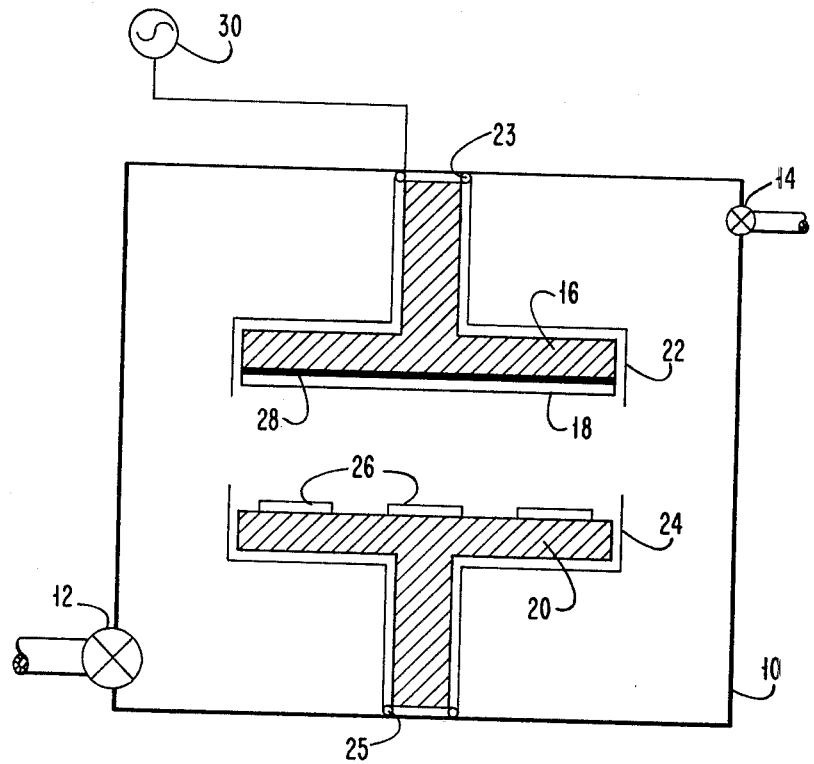

PROCESS OF BONDING SPUTTERING TARGETS TO TARGET ELECTRODES

DESCRIPTION

Technical Field

This invention relates to the bonding of sputtering targets to target electrodes.

An object of this invention is to provide an improved process for joining sputtering targets to sputtering electrodes.

Another object of this invention is to provide a bonding technique to minimize cracking of high expansion sputtering targets during sputter deposition.

Another object is to provide a target bonding process which allows quick target change without the need to remove the electrode from the system.

Another object is to provide a sputter deposition process which affords high deposition rates.

BACKGROUND ART

In the process of sputtering deposition of target material onto substrates, a major problem is the fracturing of the target due to thermal expansion induced stresses. Target fracture requires removal of the target and the target electrode from the sputtering system for replacement of the target. One approach is to use very low power densities so that thermal effects are diminished. However, with very low power densities, the deposition rate is very slow, which tends to be time-consuming and costly during mass production.

BRIEF DESCRIPTION OF THE DRAWING

The invention will be described in detail with reference to the sole FIGURE of the drawing, which is a front elevation sectional view of an apparatus employed for implementing the process of this invention.

DISCLOSURE OF THE INVENTION

With reference to the drawing, a sputtering deposition system comprises a vacuum chamber 10 and a vacuum pump 12 for evacuating the chamber to a desired background pressure level. Argon gas is fed into the chamber 10 through a bleed valve 14 to provide the necessary background environment for sputter deposition.

A target electrode 16 to which a target body 18 is mounted is positioned within the chamber 10. A substrate electrode 20 is fixed adjacent to and facing the target electrode 16. The electrodes may be water cooled to maintain a desired temperature during operation. A substrate material 22, which may be silicon, ferrite, or sapphire for example, is placed on the face of the substrate electrode 20. In this implementation, the electrodes are preferably circular, but may be square, rectangular, or any desired geometry. The target body 18 is aligned symmetrically with the target electrode 16. To eliminate spurious sputtering that may occur at the back of the electrode, each electrode 16 and 20 has a ground shield 22 and 24 respectively surrounding the peripheral and back portions, leaving the faces of the electrodes exposed for supporting target bodies and substrates. The perimeter of the target body 18 is spaced equally from the ground shield 22 around the target, so as to prevent electrical arcing to ground. O-ring seals 23 and 25 respectively are provided between the electrodes 16 and 20 and the housing of the vacuum chamber to prevent leakage of the gas.

In an implementation of this invention, the target body 18 is mounted to the face of the target electrode 16 by means of gallium-indium eutectic alloy, which forms a liquid layer 28 at ambient temperature. To effectuate the attachment of the target body, the gallium-indium eutectic alloy is swabbed onto the surface of the target body 18. Assuming that the diameter of the target body is about 10 inches, a first layer of about 1 cc. of gallium-indium eutectic is used to form a layer on the target surface. Similarly, a layer of gallium-indium eutectic is brushed across the target electrode 16. Then an additional 1–2 cc. is spread over each of the treated faces to fill in voids and to maximize adhesion. In each case, the target and its electrode are first processed to be reasonably flat prior to placing the eutectic on the faces.

The target is then placed on the target electrode so that the faces of the target body and electrode, which are covered with eutectic, are engaged to form a floating bond between the target and its electrode. The target is moved against and across the electrode 16, so as to cause any existing voids in the bond to be filled by the gallium-indium alloy, and positioned in alignment with the electrode.

The gallium-indium alloy serves as a liquid pool which minimizes the occurrence of thermal gradients and if any thermal gradients do exist, the floating target is free to expand and contract to accommodate any stresses which might result. This virtually eliminates fracturing and cracking of the target body, which would occur with solid bonds that are known to develop hot spots and stresses.

Once the target body and its electrode 16, and the substrates and electrode 20 are positioned in proper alignment, the sputtering system is activated. RF power is applied by means of power supply 30 so that sputtering of the target material occurs. During the sputtering operation, the applied voltage ionizes the argon gas, and the argon ions are attracted to the target electrode which has a relatively negative polarity. For example, the target electrode may have a voltage of $-500$ to $-2000$ volts peak-to-peak, and the ion bombardment may be in the range of energies of 100 to 2000 electron volts. The substrate electrode would be relatively more positive than the target electrode and would be biased in a range of 0 to $-1000$ volts peak-to-peak, depending upon the magnitude of the voltage seen at the target electrode. The relatively energetic ion bombardment increases the sputtering and deposition rates.

As a result of the floating bond provided by the liquid gallium-indium eutectic that holds the target body to the target electrode, it is possible to employ a relatively high input power, such as in the range of 400 to 5000 Watts, by way of example. Consequently, high deposition rates are made possible without any deleterious effects, such as fracturing of the target body. By virtue of the floating bond provided, it is also possible to rapidly change targets and supply new targets to the target electrodes, without pulling out the entire assembly of electrode and target from the vacuum chamber. This feature makes this bonding technique attractive not only for brittle materials but all target materials which do not alloy with gallium or indium. The target material may be any solid material, such as alumina, for example, or a brittle ceramic. It should be understood that the invention is not limited to a specific target material or to the particular parameters of the sputtering operation set forth above.

What is claimed is:

1. A sputtering system for coating substrates comprising:
    a vacuum chamber;
    means for introducing a gas into said chamber;
    a target material for coating said substrates;
    a first electrode having a face for mounting said target material thereto;
    a second electrode for supporting said substrates positioned adjacent to and in alignment with said first electrode;
    means for applying voltages to said electrodes to ionize said gas, so that gas ions energetically bombard said target material; and
    a eutectic metal material that is liquid at ambient temperature disposed between said first electrode and said target material for forming a floating bond therebetween.

2. A sputtering system as in claim 1 wherein said eutectic is a gallium-indium alloy.

3. A sputtering system as in claim 1, including shields disposed respectively around said electrodes.

4. A sputtering system as in claim 1 wherein said target material is aligned symmetrically relative to said target electrode.

5. A sputtering system as in claim 1, wherein said means for applying voltages is adapted to apply a voltage at the first electrode in the range of $-500$ volts to $-2000$ volts peak-to-peak.

6. A sputtering system as in claim 1, wherein said target material is ceramic.

7. A sputtering system as in claim 1, wherein said means for introducing a gas is adapted to introduce argon into said vacuum chamber.

* * * * *